(12) United States Patent
Kim

(10) Patent No.: US 7,768,775 B2
(45) Date of Patent: Aug. 3, 2010

(54) DISPLAY DEVICE

(75) Inventor: Gwang-soo Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 406 days.

(21) Appl. No.: 11/953,907

(22) Filed: Dec. 11, 2007

(65) Prior Publication Data

US 2008/0316690 A1 Dec. 25, 2008

(30) Foreign Application Priority Data

Jun. 19, 2007 (KR) .................. 10-2007-0060095

(51) Int. Cl.
*H05K 7/20* (2006.01)
*E04G 3/00* (2006.01)
*F16M 13/02* (2006.01)

(52) U.S. Cl. .............. 361/679.27; 248/284.1; 248/286.1; 361/690; 361/704; 361/707; 361/715

(58) Field of Classification Search ............ 248/284.1, 248/286.1; 361/679.27
See application file for complete search history.

(56) References Cited

U.S. PATENT DOCUMENTS

| | | | | |
|---|---|---|---|---|
| 6,494,429 B2 * | 12/2002 | Tajima | ...................... | 248/473 |
| 7,259,958 B2 * | 8/2007 | Bang et al. | ............. | 361/679.27 |
| 7,438,269 B2 * | 10/2008 | Pfister et al. | ........... | 248/292.14 |
| 7,445,187 B2 * | 11/2008 | Shin | ........................ | 248/324 |
| 7,545,632 B2 * | 6/2009 | Cho | ...................... | 361/679.27 |
| 7,673,837 B2 * | 3/2010 | Park | ......................... | 248/201 |
| 2005/0104863 A1 * | 5/2005 | Kroll | ......................... | 345/173 |
| 2007/0211205 A1 * | 9/2007 | Shibata | ...................... | 349/161 |

\* cited by examiner

*Primary Examiner*—Gregory D Thompson
(74) *Attorney, Agent, or Firm*—Sughrue Mion, PLLC

(57) ABSTRACT

A display device includes: a display unit which displays an image; a casing which supports the display unit; a pair of supporting members which are respectively combined at peripheral areas of a backside of the display unit and are supported by the casing; and a connecting member which has higher heat resistance than the supporting members and interconnects the supporting members.

16 Claims, 7 Drawing Sheets

DISPLAY DEVICE

CROSS-REFERENCE TO RELATED APPLICATIONS

This application claims priority from Korean Patent Application No. 10-2007-0060095, filed on Jun. 19, 2007 in the Korean Intellectual Property Office, the disclosure of which is incorporated herein by reference.

BACKGROUND OF INVENTION

1. Field of Invention

Apparatuses consistent with the present invention relate to a display device, and more particularly to a display device which has an improved structure for supporting a display unit onto a casing.

2. Description of the Related Art

In general, a display device has a display unit such as a liquid crystal display (LCD), a plasma display panel (PDP) and other known in the art, and a casing which accommodates and supports the display unit. A pair of bracket bars is combined with a backside of such a display unit in parallel to short sides of the display unit to support the display unit on the casing.

However, as the bracket bar is usually formed of plastics through injection molding or other technologies and considerable heat of the display unit is generated due to a backlight, a cell structure forming the PDP, a heat sink or others, the bracket bar may be easily deformed by the heat. To decrease such heat deformation, heat-resistant plastics or metals can be used. However, in this case, manufacturing cost may be excessively increased.

SUMMARY OF THE INVENTION

Accordingly, it is an aspect of the present invention to provide a display device where deformation of a bracket bar due to heat from a display unit can be minimized.

Additional aspects of the present invention will be set forth in part in the description which follows and, in part, will be obvious from the description, or may be learned by practice of the present invention.

The foregoing and/or other aspects of the present invention can be achieved by providing a display device including: a display unit which displays image; a casing which supports the display unit; a pair of supporting members which are respectively combined at peripheral areas of a backside of the display unit and are supported by the casing; and a connecting member which has higher heat resistance than the supporting members and interconnects a pair of the supporting members.

According to an aspect of the invention, the supporting members and the connecting member are disposed in parallel to a short side of the display unit.

According to an aspect of the invention, material of the supporting members includes plastics and material of the connecting member includes metal.

According to an aspect of the invention, the connecting member is disposed at an inside area of the casing where the display unit generates comparably more heat.

According to an aspect of the invention, the inside area of the casing where the display unit generates comparably more heat is an area where a heat sink is disposed.

According to an aspect of the invention, the supporting members and the connecting member are provided to be able to be combined with each other.

According to an aspect of the invention, the supporting member includes an accommodating part where both end parts of the connecting member are inserted.

According to an aspect of the invention, the accommodating part is formed so that both end parts of the connecting member can be inserted in an extending direction of the connecting member.

According to an aspect of the invention, the display device further includes a locking unit which, if both end parts of the connecting member is in a state of being inserted in the accommodating part, prevents both end parts of the connecting member from being separated in a direction reverse to its inserting direction.

According to an aspect of the invention, the display device further includes a locking unit which, if both end parts of the connecting member is in a state of being inserted in the accommodating part, prevents both end parts of the connecting member from being separated in a direction reverse to its inserting direction.

According to an aspect of the invention, the locking unit includes a bar assembling screw which couples both end parts of the connecting member and the accommodating part.

According to an aspect of the invention, the locking unit includes a bar assembling screw which couples both end parts of the connecting member and the accommodating part.

According to an aspect of the invention, the locking unit further includes a protrusion which protrudes transverse to the inserting direction of the connecting member in the accommodating part, and a holder part which is provided at each end part of the connecting member to be held by the protrusion.

According to an aspect of the invention, the locking unit further includes a protrusion which protrudes transverse to the inserting direction of the connecting member in the accommodating part, and a holder part which is provided at each end part of the connecting member to be held by the protrusion.

According to an aspect of the invention, the display device further includes an elastic supporting part which supports one of the protrusion and the holder part to be elastically releasable.

According to an aspect of the invention, the display device further includes an elastic supporting part which supports one of the protrusion and the holder part to be elastically releasable.

BRIEF DESCRIPTION OF THE DRAWINGS

The above and/or other aspects of the present invention will become apparent and more readily appreciated from the following description of the exemplary embodiments, taken in conjunction with the accompanying drawings, in which.

DETAILED DESCRIPTION OF EXEMPLARY EMBODIMENTS OF THE INVENTION

Figure 1:
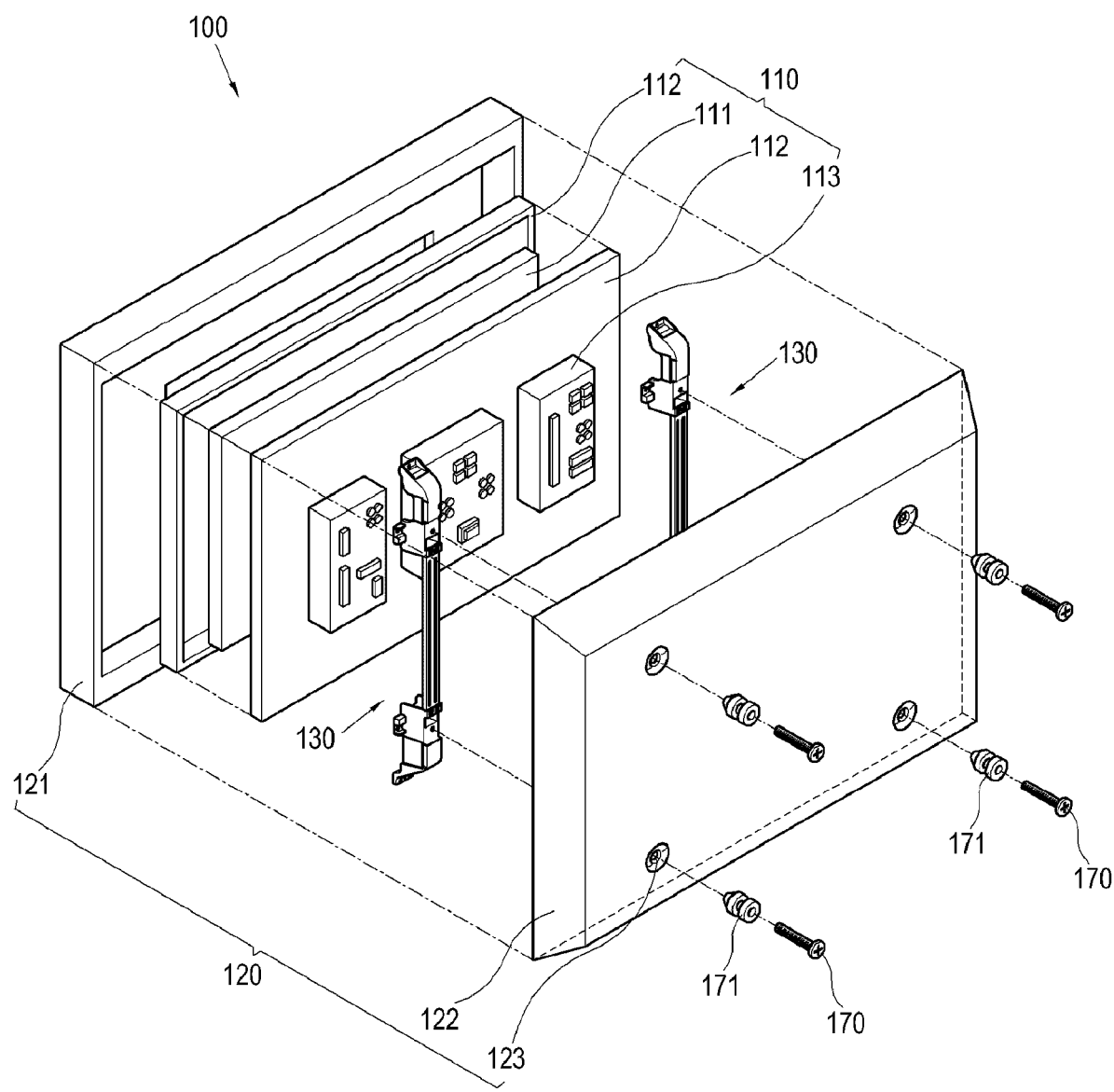
FIG. 1 is an exploded perspective view of a display device according to an exemplary embodiment of the present invention.

Reference will now be made in detail to the embodiments of the present invention, examples of which are illustrated in the accompanying drawings, wherein like reference numerals refer to like elements throughout. The embodiments are described below so as to explain the present invention by referring to the figures.

As shown in FIG. 1, a display device 100 according to an exemplary embodiment of the present invention has a display unit 110 which displays an image, a casing 120 which forms an outer appearance of the display device 100 and supports the display unit 110, and a bracket bar assembly 130 which supports the display unit 110 onto the casing 120.

The display unit 110, as shown in FIG. 1, includes a panel 111, a chassis 112 which accommodates the panel 111, and a circuit unit 113 which is combined to the chassis 112 and drives the panel 111 to display the image. At least one heat sink (not shown) is combined to the circuit unit 113.

As the display device 100 is driven, the display unit 110 generates considerable heat from the circuit unit 113 and the panel 111. Such heat is especially concentrated onto an area where the heat sink is combined to the display unit 110, thus having influence mostly on a center area of the bracket bar assembly 130.

The casing 120 includes a front casing 121 which is provided in front of the display unit 110 to form an outer appearance of a front area of the display device 100, and a rear casing 122 which is combined to the front casing 121 to accommodate the display unit 110 therein in cooperation with the front casing 121.

As shown in FIGS. 1 to 7, the rear casing 122 includes a first wall combining hole 123 which is formed at a plate surface of the rear casing 122 to combine the display device 100 on an area to install. According to an exemplary embodiment of the present invention, the rear casing 122 may be provided as a steel plate with a thickness of around 0.5 t.

As shown in FIG. 1 as an exemplary embodiment of the present invention, it is preferable but not necessary that the bracket bar assembly 130 is provided as a pair at a backside of the display unit 110.

Figure 2:
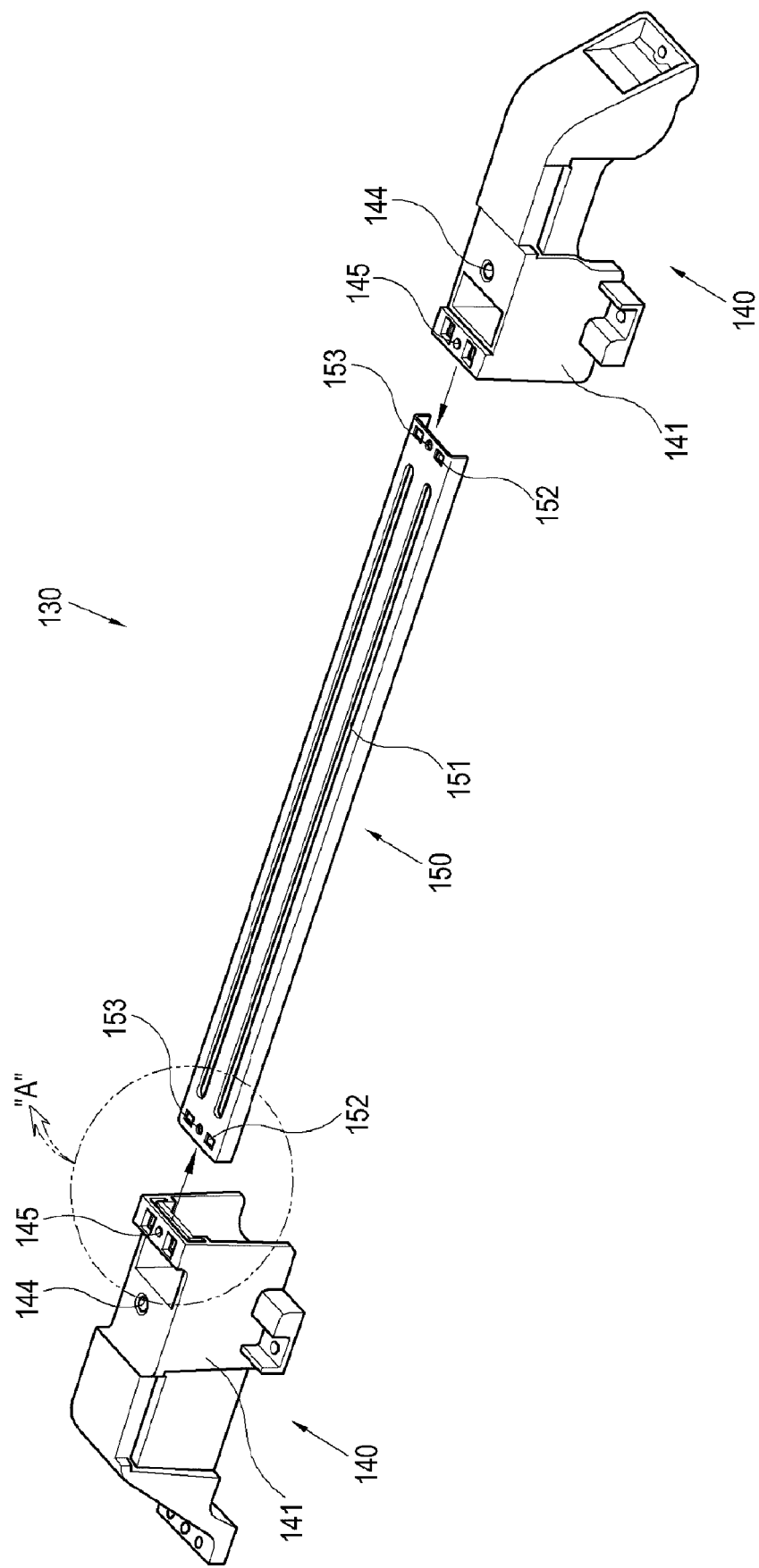
FIG. 2 is an exploded perspective view of a bracket bar assembly in FIG. 1.

As shown in FIGS. 1 and 2, each bracket bar assembly 130 includes a pair of supporting members 140 which are respectively combined to peripheral areas of the backside of the display unit 110 and are fixed with the casing 120, a connecting member 150 which has heat resistance higher than the supporting members 140 and interconnects the pair of the supporting members 140, and a locking unit which supports the combining state between the supporting members 140 and the connecting member 150.

It is preferable but not necessary that the supporting member 140 and the connecting member 150 are disposed in parallel to a short side of the display unit 110. Especially, the connecting member 150 is preferably disposed at a heat sink area where the display unit 110 generates comparably more heat.

It is enough for the connecting member 150 to have a material of higher heat resistance than that of the supporting member 140. However, as the embodiment of the present invention, it is preferable but not necessary that the material of the supporting member 140 includes plastics and the material of the connecting member 150 includes metal.

Accordingly, as the supporting member 140 is provided as plastics, manufacturing cost of the bracket bar assembly 130 can be comparably reduced. Also, as the connecting member 150 is provided as metal whose heat resistance and heat conductivity are comparably higher than the supporting member 140, deformation of the connecting member 150 due to the heat generated by the display unit 110 can be minimized.

The supporting member 140 can be combined with the connecting member 150 by various processes such as insert injection, fusion, assembling and others. However, as the exemplary embodiment of the present invention, it is preferable but not necessary that the supporting member 140 and the connecting member 150 are detachably combined with the locking unit.

As shown in FIGS. 2 to 6, the supporting member 140 includes a supporting main body 141, an accommodating part 142 which has an accommodating opening 142a formed on the supporting main body 141 so that both end parts of the connecting member 150 can be slidingly combined to the supporting main body 141, and a second wall combining hole 144 which is formed at the supporting main body 141 to correspond to the first wall combining hole 123.

Figure 7:
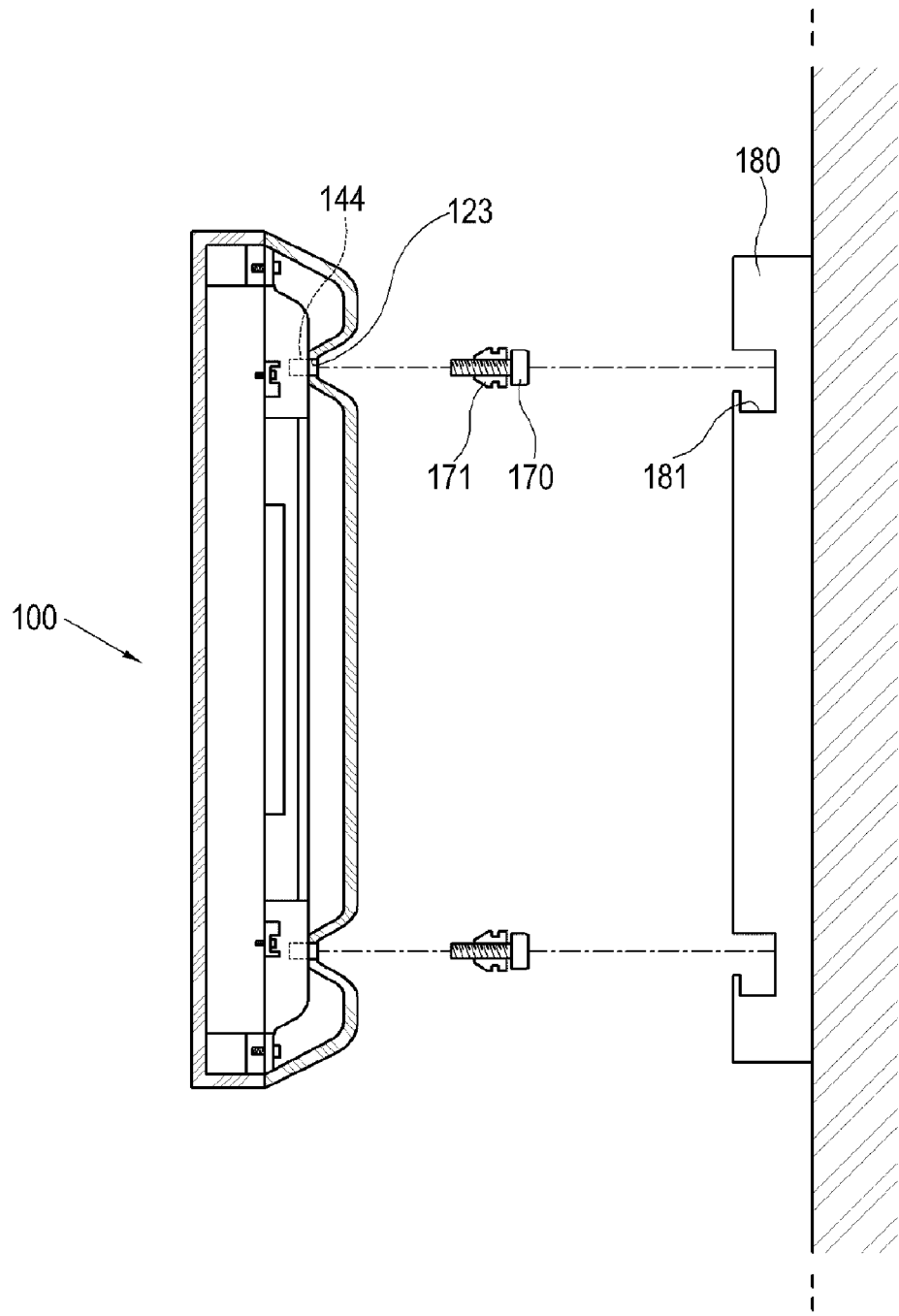
FIG. 7 is a schematic view for showing method of combining the display device according to the exemplary embodiment of the present invention onto a wall.

Accordingly, as shown in FIG. 7, a wall combining screw 170 is combined to the first wall combining hole 123, the second wall combining hole 144 and a wall combining bracket 180 thus enabling the display device 100 to be used as a wall-mounted type display device.

As the exemplary embodiment of the present invention, it is preferably but not necessary that the accommodating part 142 is formed such that both end parts of the connecting member 150 can be inserted in an extending direction of the connecting member 150.

Figure 5:
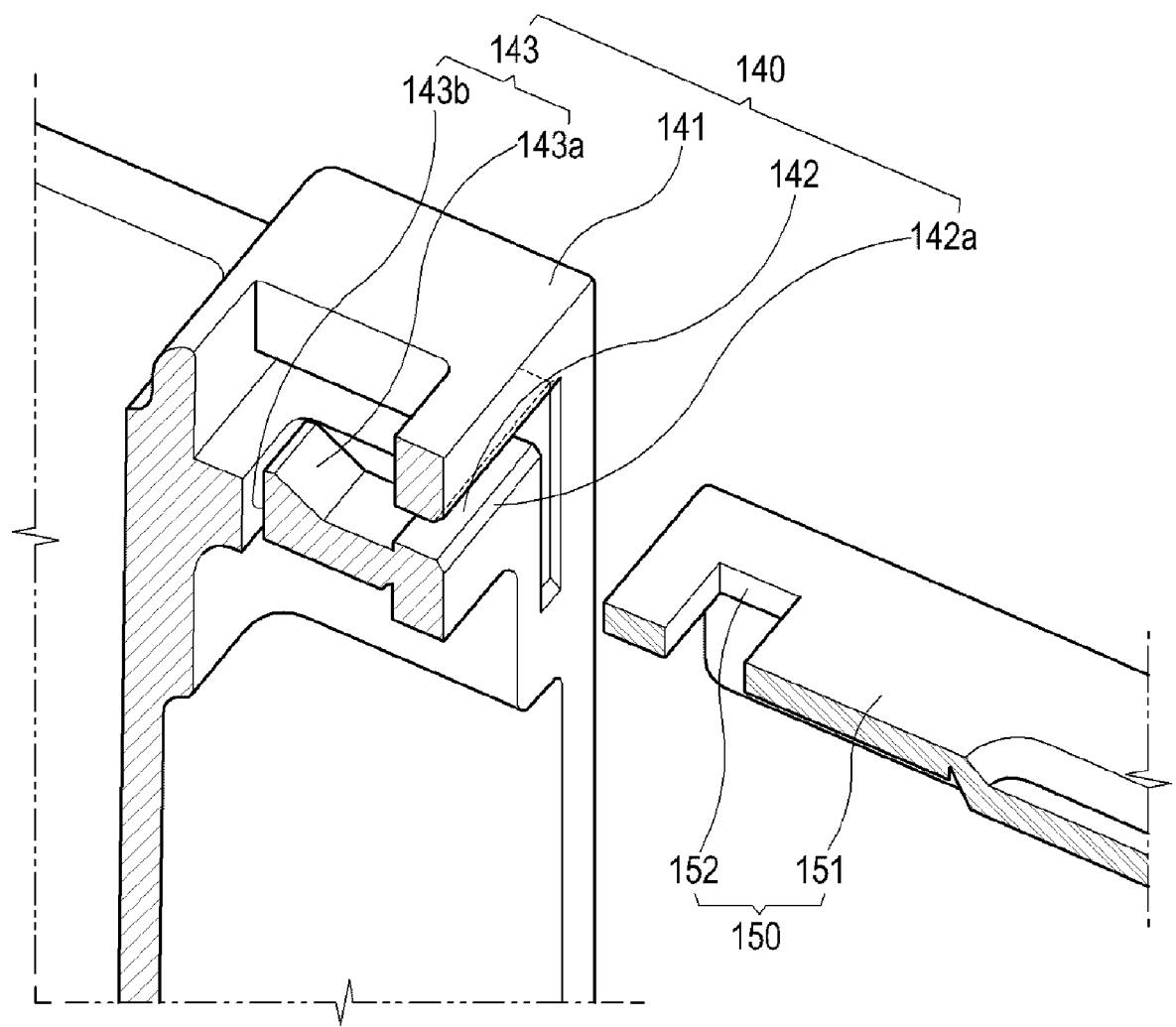
FIG. 5 is a sectional perspective view along V-V in FIG. 3.
Figure 6:
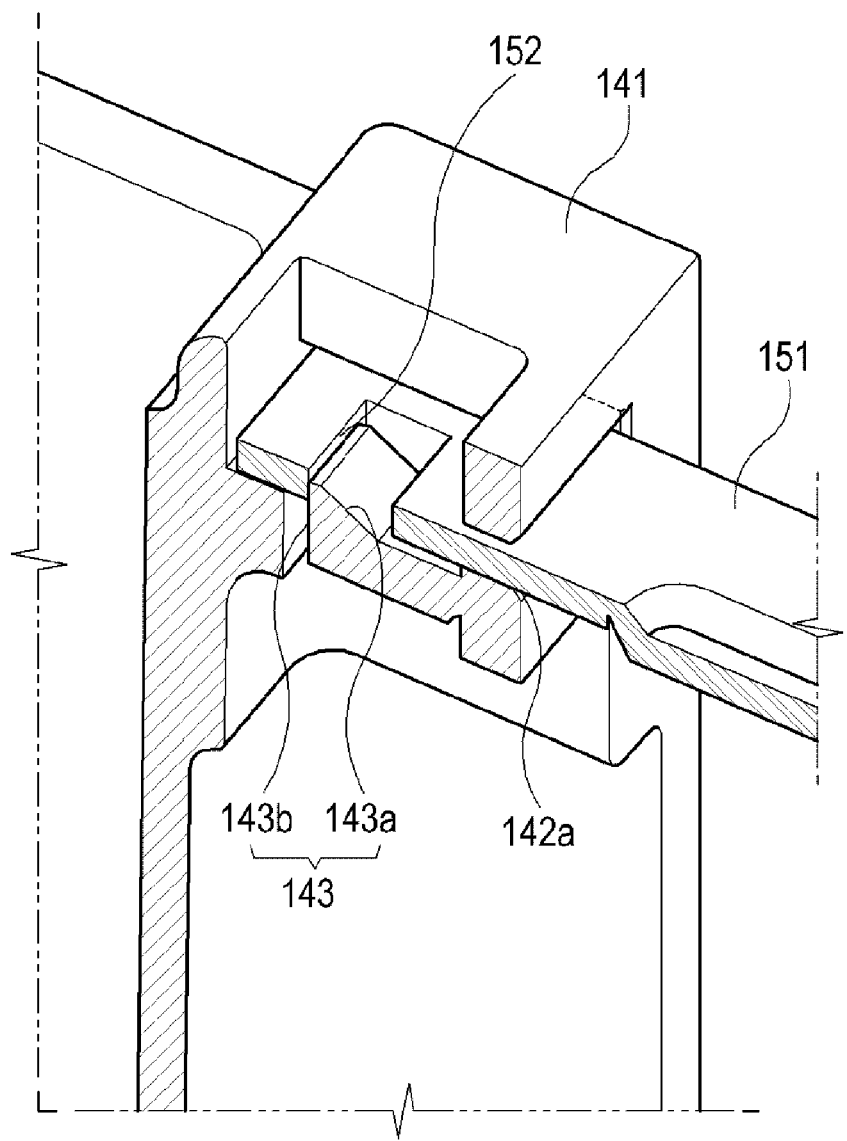
FIG. 6 is a sectional perspective view along VI-VI in FIG. 4.

As shown in FIGS. 5 and 6, it is preferable but not necessary that the peripheral area of the accommodating opening 142a is chamfering processed. Accordingly, both end parts of the connecting member 150 can be easily inserted into the accommodating part 142 of the supporting member 140.

Figure 3:
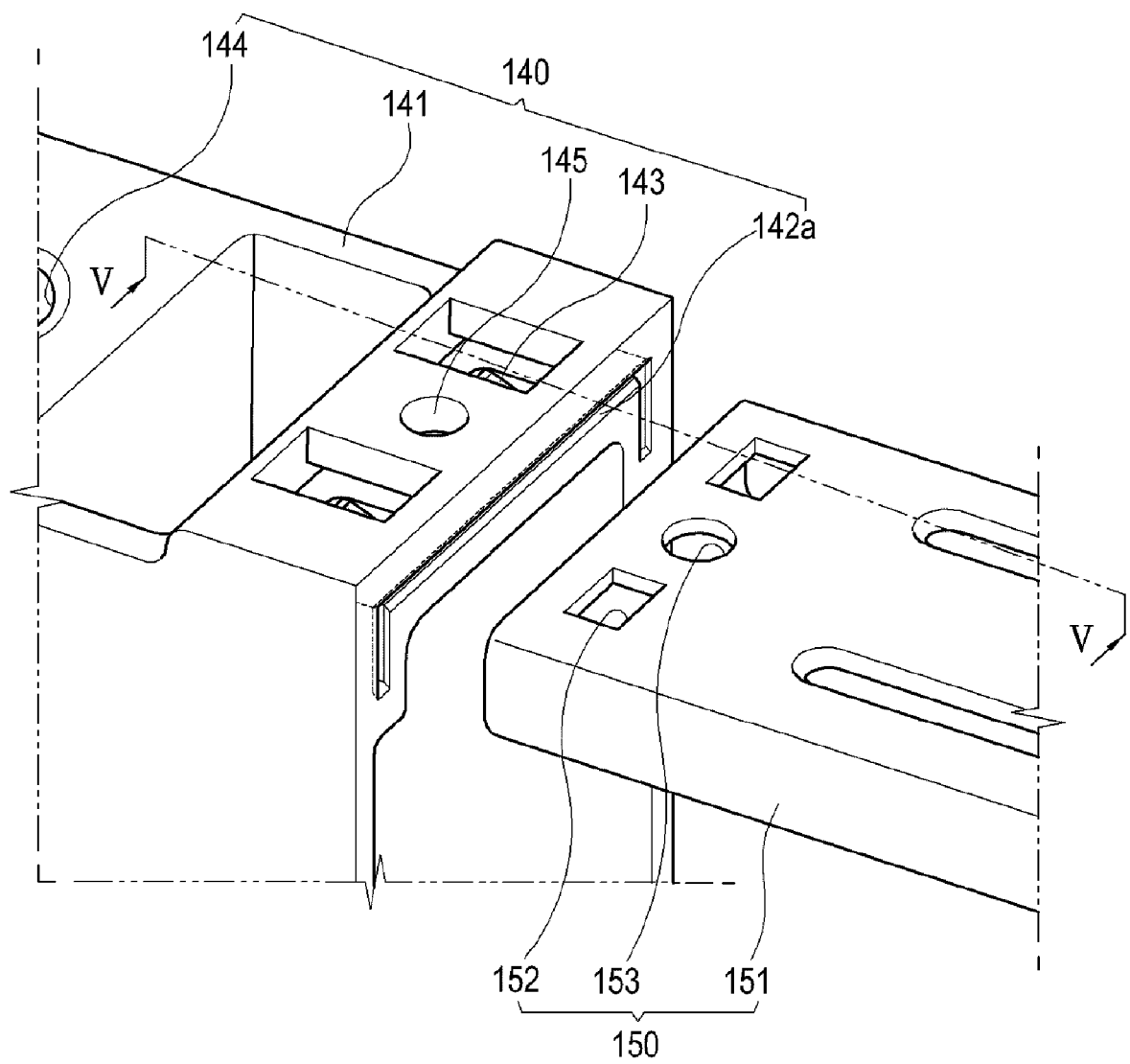
FIG. 3 is an expanded perspective view of an area "A" in FIG. 2.

As shown in FIGS. 2 and 3, the connecting member 150 includes a connecting main body 151 provided by a shape of a long stick with its both ends combined to the accommodating part 142.

As the exemplary embodiment of the present invention, it is preferable but not necessary that the connecting member 150 is made of cold-rolled steel with a thickness of around 1.0 t. Accordingly, as the connecting member 150 made of steel is detachably combined to the supporting member 140 made of plastics or the like, heat deformation of the bracket bar assembly 130 can be minimized and overall production cost can be reduced.

The locking unit prevents both end parts of the connecting member 150 in an inserted state into the accommodating part 142 from being separated in a direction reverse to a direction for inserting and includes a bar assembling screw 160 which couples both end parts of the connecting member 150 with the accommodating part 142, a protrusion 143 which is protruded from an inner side of the accommodating part 142 transverse to the inserting direction of the connecting member 150, and a holder part 152 which is provided at both end parts of the connecting member 150 to be held by the protrusion 143.

As shown in FIG. 5, the protrusion 143 includes an inclined surface 143a and an elastic supporting part 143b which are formed at the accommodating part 142 to prevent the connecting member 150 from being separated in the direction reverse to the direction in which the connecting member 150 is combined to the accommodating part 142.

As shown in FIGS. 5 and 6, the protrusion 143 is formed at the supporting main body 141. Also, as the combining main body 151 advances by sliding on the inclined surface 143a, the protrusion 143 elastically resists the connecting main body 151 until the holder part 152 is held by the elastic supporting part 143b. Accordingly, the connecting member 150 can easily slide to be combined to the supporting member 140.

The elastic supporting part 143b is formed at the supporting main body 141 and supports the holder part 152 so that the holder part 152 can be elastically released. As the exemplary embodiment of the present invention, the elastic supporting part 143b is described to support the holder part 152 so that the holder part 152 can be elastically released. However, as another exemplary embodiment of the present invention, the elastic supporting part 143b may support the protrusion 143 so that the protrusion 143 can be elastically released.

Figure 4:
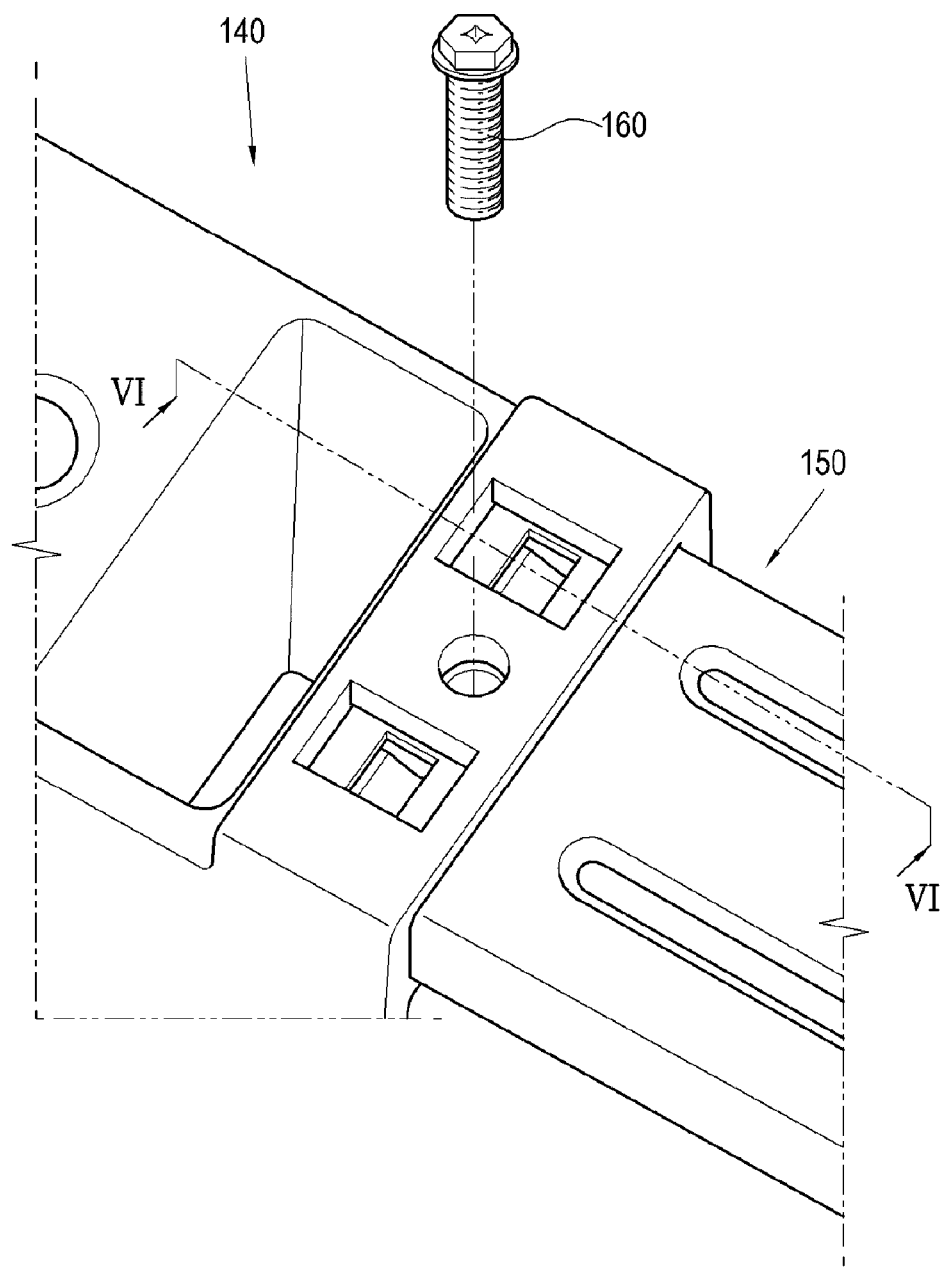
FIG. 4 is a perspective view illustrating a combined state of FIG. 3.

As shown in FIGS. 2 to 4, the holder part 152 is formed as a hole at both end parts of the connecting main body 151. As the exemplary embodiment of the present invention, it is preferable but not necessary that the holder part 152 is provided as a pair at each end part of the connecting main body 151 transverse to the extending direction of the connecting main body 151. Accordingly, it is preferable but not necessary that the protrusion 143 is formed as a pair at each accommodating part 142 to correspond to the holder part 152.

Also, as shown in FIG. 3, it is preferable but not necessary that the supporting member 140 further includes a first coupling hole 145 which is formed between a pair of the protrusions 143 and that the connecting member 150 further includes a second coupling hole 153 which is formed at the connecting main body 151 to correspond to the first coupling hole 145.

Accordingly, as shown in FIG. 4, the bar assembling screw 160 connecting the first coupling hole 145 and the second coupling hole 153 combines the supporting member 140 and the connecting member 150 still more firmly.

As the exemplary embodiment of the present invention, it is described that the accommodating part 142 is provided at the supporting member 140 and both end parts of the connecting member 150 are inserted into the accommodating part 142. However, as another exemplary embodiment of the present invention, the accommodating part may be provided at both end parts of the connecting main body 151 and the end part of the supporting member 140 may be inserted into the accommodating part of the connecting member 150.

Accordingly, as the bracket bar assembly 130 is provided to support the display unit 110 in the casing 120 so that the display device 100 can be used as the wall-mounted type display device, the heat deformation of the bracket bar assembly 130 can be minimized and thus reducing the overall manufacturing cost of the display device 100.

With a configuration described above, manufacturing process of the display device 100 according to the exemplary embodiment of the present invention and a way of using the display device 100 as the wall-mounted type display device are described hereinafter with reference to FIGS. 1 to 7.

Firstly, the panel 111 is accommodated within the chassis 112 to combine the panel 111 to the chassis 112, and the circuit unit 113 is combined to the backside of the chassis 112 to provide the display unit 110.

Next, the connecting member 150 having its material such as metal or the like is combined between the pair of supporting members 140, and both end parts of the connecting main body 151 are inserted into the respective accommodating parts 142 until the holder part 152 is held by the protrusion 143 of the supporting member 140, thereby assembling the bracket bar assembly 130.

The bar assembling screw 160 connects the first coupling hole 145 and the second coupling hole 153 to combine the supporting member 140 and the connecting member 150 still more firmly.

Then, the pair of bracket bar assemblies 130 provided as described above are placed to the backside of the display unit 110 and both end parts of the bracket bar assembly 130 are combined to the front casing 121.

Accordingly, the display unit 110 can be combined to the casing 120 by using the bracket bar assembly 130 whose heat deformation can be minimized.

Lastly, the display device 100 is provided after combining the rear casing 122 to the front casing 121.

On the other hand, using the display device 100 as the wall-mounted type display device by combining the display device 100 onto the wall is described hereinafter.

Firstly, a combination supporting ring 171 is combined to the wall combining screw 170, and the wall combining screw 170 to which the combination supporting ring 171 is combined is combined to the first wall combining hole 123 that is formed at the rear casing 122 and the second wall combining hole 144 that is formed at the bracket bar assembly 130.

Next, a head part of the wall combining screw 170 which is combined to the display device 100 is inserted into a coupling hollow 181 of the wall combining bracket 180 which is combined to the wall. Then, if the display device 100 is slightly lowered, the combination supporting ring 171 is held by the coupling hollow 181, so that the display device 100 is combined to the wall combining bracket 180.

Therefore, the display device 100 can be easily used as the wall-mounted type display device by the bracket bar assembly 130 which is provided to be able to be assembled and whose heat deformation can be minimized.

As described hereinbefore, according to the present invention, the deformation of the bracket bar, which supports the display unit onto the casing, due to the heat from the display unit can be minimized.

Also, according to the present invention, the manufacturing cost of the bracket bar can be comparably reduced.

Although a few exemplary embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A display device comprising:
   a display unit which displays an image;
   a casing which supports the display unit;
   a bracket bar assembly, provided at a backside of the display unit, that includes a pair of supporting members which are respectively disposed at peripheral areas of the backside of the display unit and are supported by the casing; and
   a connecting member which has a higher heat resistance than the pair of supporting members and interconnects the pair of the supporting members.

2. The display device according to claim 1, wherein the bracket bar assembly having the pair of supporting members and the connecting member is disposed in parallel to a short side of the display unit.

3. The display device according to claim 2, wherein a material of the pair of supporting members comprises plastic and a material of the connecting member comprises metal.

4. The display device according to claim 3, wherein the casing includes a front casing and a rear casing forming an inside area therebetween, and the connecting member is disposed at the inside area of the casing.

5. The display device according to claim 4, wherein a heat sink is disposed in the inside area of the casing, thus causing the inside area to be hotter than other areas of the display device, and the connecting member is disposed closer to the heat sink than the pair of supporting members.

6. The display device according to claim 5, further comprising a locking unit that detachably connects the pair of supporting members with the connecting member.

7. The display device according to claim 6, wherein the locking unit includes an accommodating part formed in each supporting member into which an end part of the connecting member is slidingly inserted, respectively.

8. The display device according to claim 7, wherein each of the accommodating parts includes an accommodating opening having chamfered surfaces to facilitate insertion of the end parts of the connecting member in a longitudinal direction of the connecting member.

9. The display device according to claim 8, wherein the locking unit prevents both end parts of the connecting member from being separated in a direction reverse to its inserting direction.

10. The display device according to claim 7, wherein the locking unit prevents both end parts of the connecting member from being separated in a direction reverse to its inserting direction.

11. The display device according to claim 10, wherein each of the locking units further comprises a bar assembling screw, a first coupling hole formed on the supporting member and a second coupling hole formed on the connecting member, wherein said bar assembling screw inserts in said first and second coupling holes, thereby securing both end parts of the connecting member to the accommodating parts of the supporting members.

12. The display device according to claim 9, wherein each of the locking units further comprises a bar assembling screw, a first coupling hole formed on the supporting member and a second coupling hole formed on the connecting member, wherein said bar assembling screw inserts in said first and second coupling holes, thereby securing both end parts of the connecting member to the accommodating parts of the supporting members.

13. The display device according to claim 12, wherein each of the locking units further comprises a protrusion which protrudes transverse to the inserting direction of the connecting member in each accommodating part, and a holder part which is provided at each end part of the connecting member to be held by the protrusion.

14. The display device according to claim 11, wherein each of the locking units further comprises a protrusion which protrudes transverse to the inserting direction of the connecting member in each accommodating part, and a holder part which is provided at each end part of the connecting member to be held by the protrusion.

15. The display device according to claim 14, further comprising an elastic supporting part which supports one of the protrusion and the holder part to be elastically releasable.

16. The display device according to claim 13, further comprising an elastic supporting part which supports one of the protrusion and the holder part to be elastically releasable.

* * * * *